United States Patent
Kuo et al.

(10) Patent No.: US 8,479,060 B2
(45) Date of Patent: Jul. 2, 2013

(54) MEMORY WITH SELF-TEST FUNCTION AND METHOD FOR TESTING THE SAME

(75) Inventors: Shuo-Fen Kuo, Tainan (TW); Jih-Nung Lee, Hsinchu County (TW); Sung-Kuang Wu, Taipei County (TW)

(73) Assignee: Realtek Semiconductor Corp., Hsinchu (TW)

( * ) Notice: Subject to any disclaimer, the term of this patent is extended or adjusted under 35 U.S.C. 154(b) by 264 days.

(21) Appl. No.: 13/007,691

(22) Filed: Jan. 17, 2011

(65) Prior Publication Data

US 2011/0179323 A1    Jul. 21, 2011

(30) Foreign Application Priority Data

Jan. 18, 2010    (TW) .............................. 99101195 A

(51) Int. Cl.
G11C 29/00        (2006.01)
(52) U.S. Cl.
USPC .......................... 714/719; 714/733; 714/729
(58) Field of Classification Search
USPC ................. 714/719, 733, 726, 729, 732, 727, 714/703, 712, 6.32
See application file for complete search history.

(56) References Cited

U.S. PATENT DOCUMENTS

| | | | |
|---|---|---|---|
| 5,325,367 A * | 6/1994 | Dekker et al. ................ | 714/718 |
| 6,085,334 A * | 7/2000 | Giles et al. .................. | 714/6.32 |
| 6,564,348 B1 | 5/2003 | Barenys et al. | |
| 6,687,865 B1 * | 2/2004 | Dervisoglu et al. .......... | 714/726 |
| 7,213,186 B2 * | 5/2007 | Chien .......................... | 714/733 |
| 7,603,595 B2 * | 10/2009 | Sasaki .......................... | 714/718 |
| 2004/0193984 A1 | 9/2004 | Soundron | |
| 2009/0254788 A1 | 10/2009 | Cervantes et al. | |

FOREIGN PATENT DOCUMENTS

CN    101339811    1/2009

OTHER PUBLICATIONS

SIPO Office Action dated Jun. 27, 2012.
English translation abstract of CN101339811 (Published Jan. 7, 2009).

* cited by examiner

*Primary Examiner* — Fritz Alphonse
(74) *Attorney, Agent, or Firm* — McClure, Qualey & Rodack, LLP

(57) ABSTRACT

The present invention relates to a memory with a self-test function and a method for testing the same. The memory comprises a testing unit, a memory unit, and a comparison module. The method for testing the memory comprises steps of the testing unit producing a pattern signal; a first storage block of the memory unit storing storage data, and outputting the storage data according to the pattern signal; a second storage block of the memory storing a compare signature corresponding to the storage data; and the compare module producing a test signature according to the storage data output by the memory unit, and comparing the test signature to the compare signature and outputting a testing result for judging validity of the memory unit. Thereby, the memory unit according to the present invention is partitioned into two storage blocks for storing the storage data and the compare signature, respectively, and thus achieving the purposes of saving the testing time, costs, and hardware resources.

10 Claims, 2 Drawing Sheets

MEMORY WITH SELF-TEST FUNCTION AND METHOD FOR TESTING THE SAME

This application claims the benefit of Taiwan application Serial No. 099101195, filed Jan. 18, 2010, the subject matter of which is incorporated herein by reference.

FIELD OF THE INVENTION

The present invention generally relates to a memory and a method for testing the same, and particularly to a memory with a self-test function and a method for testing the same.

BACKGROUND OF THE INVENTION

Because of the increase in the capacity of modern memories, the time spent on testing them increases correspondingly, which poses an extra cost for memory manufacturers. The ability to test a memory is important for ensuring normal operations of the memory as well as for saving costs.

The Built-in Self-Test (BIST) technology generally adopted by manufacturers is applied to testing if a memory is normal. In the architecture of the Memory Built-in Self-Test (MBIST), a built-in self-test circuit can be used to test the memory. The built-in self-test circuit provides a series of patterns, such as the march test or the checkboard pattern, to the memory. Then the circuit compares the outputs with an expected response. Because the patterns have high regularity, a comparator can be used to compare directly the outputs of the memory and the reference data to ensure that an error response coming from the memory is marked with a test fail.

US publication number 2004/0193984 and the U.S. Pat. No. 6,564,348 are examples of prior art approaches and architectures.

However, when the built-in self-test circuit according to the prior art tests a read-only memory (ROM), the compression technology is used for compressing a great deal of data stored in the ROM to a test signature, which is stored in a digital circuit of the chip beforehand. In mass production, testing is performed by comparing the signature of the memory to the compare signature stored in the digital circuit. Nevertheless, during the process of verification, when the data stored in the ROM needs to be modified, the chip must be re-laid-out to modify the pre-stored value, so that the compare signature stored in the digital circuit of the chip can be modified correspondingly. Consequently, the technology according to the prior art as described above needs to consume the limited hardware resources (needing extra digital circuitry of the chip for storing the compare signature in advance) and the time for engineering design (for example, engineering change of the chip).

Accordingly, it is desired to provide a novel memory with a self-test function and a method for testing the same, which can avoid consuming the limited hardware resources as well as reducing the engineering time and testing time.

SUMMARY

An objective of the present invention is to provide a memory with a self-test function and a method for testing the same, which partition a memory unit into two storage blocks for storing storage data and a compare signature, respectively. Therefore, the testing time, costs, and hardware resources can be saved.

Another objective of the present invention is to provide a memory with a self-test function and a method for testing the same. By allocating the storage address of a second storage block to the last address of the storage addresses of the memory unit, the time required for modifying the memory can be shortened, and hence enhancing the efficiency of modifying the memory.

The memory with a self-test function according to an embodiment of the present invention comprises a testing unit, a memory unit, a compression unit, and a comparison unit. The testing unit produces and outputs a pattern signal. The memory unit has a first storage block and a second storage block. The first storage blocks stores storage data, and outputs the storage data according to the pattern signal. The second storage block stores a compare signature corresponding to the storage data. The compression unit compresses the storage data and produces a test signature. The comparison unit compares the test signature and the compare signature and outputs a comparison result. According to the comparison result, it is known if the memory is normal or not. Thereby, the present invention can achieve the purposes of saving the testing time, costs, and hardware resources.

DETAILED DESCRIPTION

Figure 1:
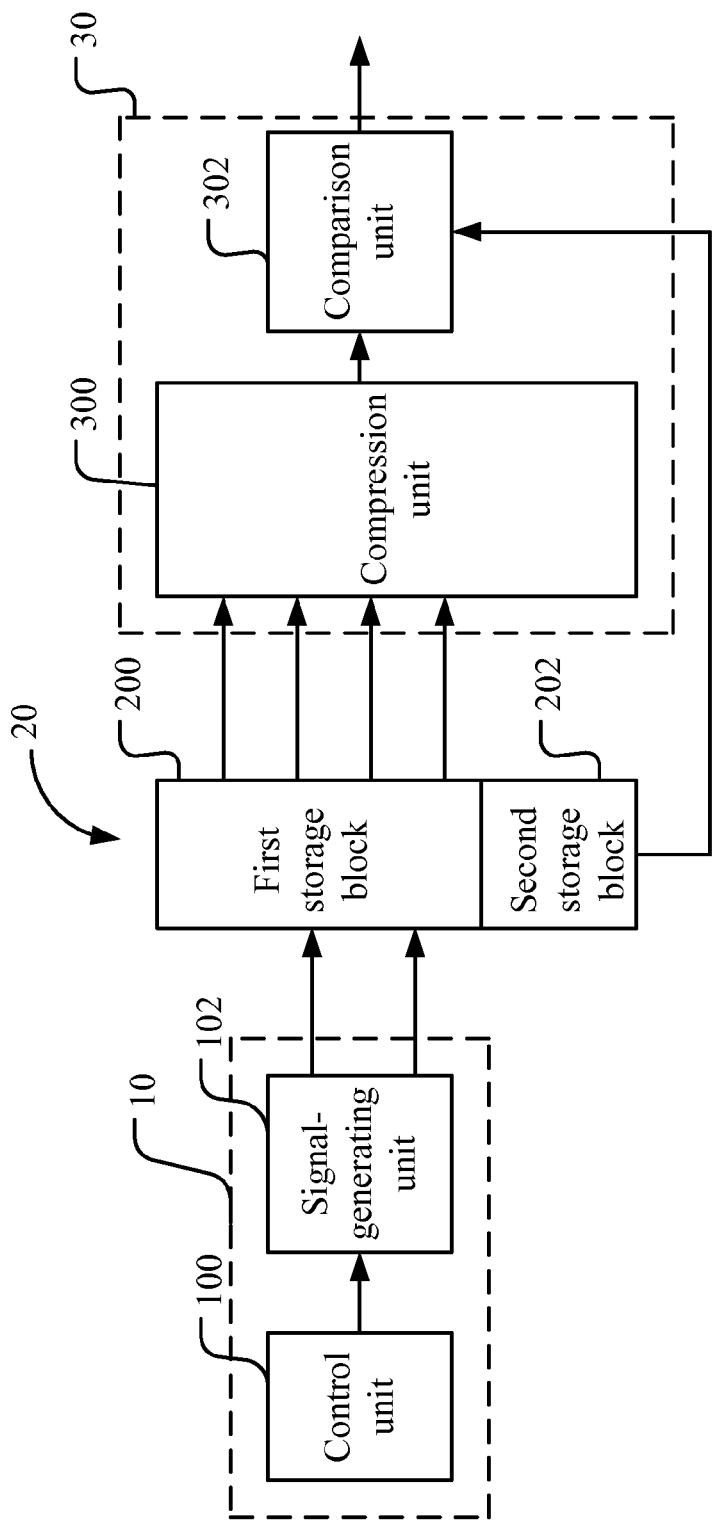
FIG. 1 shows a block diagram according to a preferred embodiment of the present invention.

The following detailed description is provided to described embodiments of the present invention. FIG. 1 shows a block diagram according to a preferred embodiment of the present invention. As shown in the figure, the memory with a self-test function according to the present invention comprises a testing unit 10, a memory unit 20, and a comparison module 30. The testing unit 10 is used for producing a pattern signal, and outputting the pattern signal to the memory unit 20. According to an embodiment, the testing unit 10 can be MBIST. If the memory is a ROM, the testing unit 10 can be ROM BIST. According to another embodiment, the testing unit 10 includes a control unit 100 and a signal-generating unit 102. The control unit 100 is used for producing a control signal, and transmitting the control signal to the signal-generating unit 102, which produces a pattern signal after receiving the control signal. According to an embodiment, the signal-generating unit 102 is a pattern generator.

The memory unit 20 is coupled to the testing unit 10, and includes a first storage block 200 and a second storage block 202. The first storage block 200 is used for storing storage data; the second storage block 202 is used for storing a compare signature corresponding to the storage data. After the memory unit 20 receives the pattern signal, it outputs the storage data and the compare signature to the comparison module 30 according to the pattern signal, wherein the first storage block 200 is used for outputting the storage data, and the second storage block 202 is used for outputting the compare signature. The comparison module 30 is coupled to the memory unit 20, and produces a test signature according to the storages data stored in the first storage block 200 of the memory unit 20. Then, the comparison module 30 compares the test signature to the compare signature and produces a testing result for judging if the storage data stored in the first storage block 200 of the memory unit is valid or not.

Certain embodiments partition the memory unit 20 into a first storage block 200 and a second storage block 202 for storing the storage data and the compare signature, respectively. Thereby, when the storage data needs to be modified, the system avoids storing the storage data and the compare signature at different locations should be modified, thus saving the testing time, costs, and hardware resources. In addition, when the storage data needs to be modified, the storage data stored in the first storage block 200 of the memory unit 20 and the compare signature stored in the second storage block 202 of the memory unit 20 are updated simultaneously.

In addition, the comparison module 30 of the memory with a self-test function according to embodiments of the present invention includes a compression unit 300 and a comparison unit 302. The compression unit 300 compresses the storage data and produces the test signature. A preferred embodiment of the compression unit 300 is a multiple-input signature register (MISR). The comparison unit 302 compares the test signature and the compare signature and produces the testing result. Thereby, whether the storage data stored in the first storage block 200 of the memory unit 20 is valid can be judged. In other words, when the test signature produced by the compression unit 300 is different from the compare signature, it indicates that the storage data stored in the memory unit 20 is invalid. On the other hand, when the test signature produced by the compression unit 300 is identical to the compare signature, it indicates that the storage data stored in the memory unit 20 is valid.

Moreover, because the memory unit 20 according to embodiments of the present invention is a ROM, when the storage data in the memory unit 20 need to be modified owing to various reasons, it is necessary to modify the compare signature correspondingly. Because the memory unit 20 according to the present invention is partitioned into the first and second storage blocks 200, 202 for storing the storage data and the compare signature, respectively. Thereby, the storage data and the compare signature can be stored in the same memory unit 20. When the storage data stored in the memory unit 20 needs to be modified, the storage data and the compare signature can be modified simultaneously, and hence the testing time, costs, and hardware resources can be reduced.

The second storage block 202 of the memory unit 20 according to the present invention can be located at a specific address of the storage addresses of the memory unit 20, such as the last address, so that when the storage data stored in the first storage block 200 of the memory unit 20 is modified, the compare signature stored in the second storage block 200 of the memory unit 20 can be modified correspondingly with convenience. Accordingly, the time for modifying the memory can be shortened, and thus enhancing the efficiency of modifying the memory.

Figure 2:
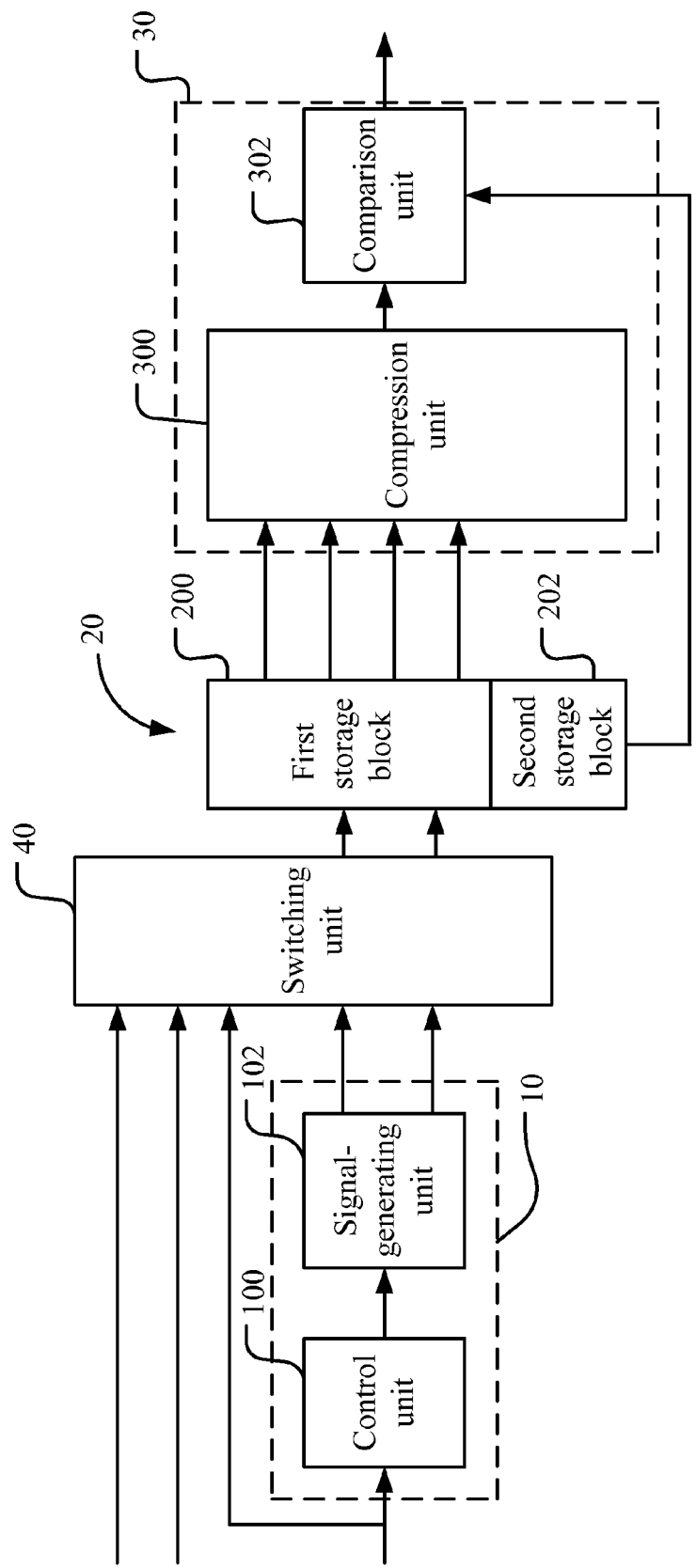
FIG. 2 shows a block diagram according to another embodiment of the present invention.

FIG. 2 shows a block diagram according to another embodiment of the present invention. As shown in FIG. 2, the difference between this embodiment and the one in FIG. 1 is, according to the embodiment of FIG. 2, the memory with a self-test function further comprises a switching unit 40. The read mode of the memory according to the present embodiment includes a test mode and a normal mode. The test mode is used for the tests on the memory when the memory is manufactured; the normal mode of the memory is used for normal operations of the memory after the tests are performed. Thereby, the switching unit 40 switches the read mode of the memory to the test mode or the normal according to a switch signal. The switch signal is produced by a control circuit (not shown in the figure). The control circuit is used for controlling the memory to operate in the test mode or the normal mode. When the read mode of the memory unit 20 is the test mode, the switching unit 40 transmits the pattern signal to the memory unit 20 for outputting the storage data to the comparison module 30. On the other hand, when the read mode of the memory unit 20 of the memory is the normal mode, the switching unit 40 transmits a system signal to the memory unit 20 for outputting the storage data to the exterior of the memory. The switching unit 40 can be a test collar or a multiplexer.

In summary, the memory unit 20 according to the present invention is partitioned into two storage blocks for storing the storage data and the compare signature, respectively, so that the storage data and the compare signature can be stored in the same memory unit 20. Thereby, the storage data and the corresponding compare signature can be modified simultaneously, thereby saving testing time, costs, and hardware resources.

It should be appreciated that the foregoing description is only embodiments of the present invention, and should not be viewed as limiting upon the scope and spirit of the present invention. Those equivalent changes or modifications made according to the shape, structure, feature, or spirit, described in the claims of the present invention are included in the appended claims of the present invention.

The invention claimed is:

1. A memory with a self-test function, comprising:
   a testing unit, producing a pattern signal;
   a memory unit, coupled to said testing unit, partitioned into a first storage block and a second storage block, said first storage block storing storage data and outputting said storage data according to said pattern signal, and said second storage block storing a compare signature corresponding to said storage data; and
   a compare module, coupled to said memory unit, producing a test signature according to said storage data output by said memory unit, and comparing said test signature to said compare signature and outputting a testing result.

2. The memory with a self-test function of claim 1, wherein said storage data stored in said first storage block and said compare signature stored in said second storage block are updated simultaneously.

3. The memory with a self-test function of claim 1, wherein said compare module includes:
   a compression unit, compressing said storage data and producing said test signature; and
   a comparison unit, comparing said test signature and said compare signature, and outputting said testing result.

4. The memory with a self-test function of claim 1, and further comprising a switching unit, switching a read mode of said memory to a test mode or a normal mode.

5. The memory with a self-test function of claim 4, wherein said switching unit is a test collar or a multiplexer.

6. The memory with a self-test function of claim 1, wherein said testing unit is a memory built-in self-test.

7. The memory with a self-test function of claim 1, wherein said memory unit is a read-only memory.

8. The memory with a self-test function of claim 3, wherein said compression unit is a multiple-input signature register.

9. A method for testing a memory with a self-test function, comprising steps of:
   producing a pattern signal;
   outputting storage data according said pattern signal;
   producing a compare signature corresponding to said storage data, and said storage data and said compare signature stored in a same memory unit;
   producing a test signature according to said storage data output by said memory unit; and
   comparing said test signature to said compare signature, and outputting a testing result.

10. The method for testing a memory with a self-test function of claim 9, wherein said memory unit is partitioned into a first storage block and a second storage block; said first storage stores said storage data; and said second storage block stores said compare signature.

\* \* \* \* \*